United States Patent
Formenti et al.

(10) Patent No.: US 12,322,958 B2
(45) Date of Patent: Jun. 3, 2025

(54) ELECTROSTATIC DISCHARGE (ESD) PROTECTION CIRCUIT WITH DISABLE FEATURE BASED ON HOT-PLUG CONDITION DETECTION

(71) Applicant: TEXAS INSTRUMENTS INCORPORATED, Dallas, TX (US)

(72) Inventors: Jose Antonio Vieira Formenti, Dallas, TX (US); Zhao Fang, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/396,987

(22) Filed: Dec. 27, 2023

(65) Prior Publication Data

US 2024/0128744 A1 Apr. 18, 2024

Related U.S. Application Data

(62) Division of application No. 16/904,461, filed on Jun. 17, 2020, now Pat. No. 11,894,673.

(60) Provisional application No. 62/862,321, filed on Jun. 17, 2019.

(51) Int. Cl.
*H02H 9/04* (2006.01)
*H10D 89/60* (2025.01)

(52) U.S. Cl.
CPC ........... *H02H 9/046* (2013.01); *H10D 89/711* (2025.01); *H10D 89/911* (2025.01)

(58) Field of Classification Search
CPC .. H02H 9/046; H01L 27/0259; H01L 27/0288
See application file for complete search history.

(56) References Cited

U.S. PATENT DOCUMENTS

| | | | |
|---|---|---|---|
| 2006/0262470 A1* | 11/2006 | Marum | H02H 9/046 |
| | | | 361/56 |
| 2013/0285668 A1 | 10/2013 | Savich | |
| 2015/0077887 A1 | 3/2015 | Nair | |
| 2016/0285255 A1* | 9/2016 | O'Donnell | H02H 9/02 |
| 2017/0256933 A1* | 9/2017 | Chen | H02H 9/046 |
| 2018/0145600 A1 | 5/2018 | Zhou | |
| 2019/0049479 A1* | 2/2019 | Malhotra | A61B 5/721 |
| 2019/0260203 A1 | 8/2019 | Seidl | |
| 2020/0395753 A1 | 12/2020 | Formenti | |

\* cited by examiner

*Primary Examiner* — Khaja Ahmad
(74) *Attorney, Agent, or Firm* — Valerie M. Davis; Frank D. Cimino

(57) ABSTRACT

A circuit includes input terminals adapted to be coupled to a battery; a ground terminal; and an electrostatic discharge (ESD) protection circuit coupled to the input terminals. The ESD protection circuit includes: a switch coupled between the ground terminal and the input terminals; and a control circuit coupled to the input terminals and to the switch. The control circuit is configured to: detect an ESD event at one of the input terminals; detect a transient voltage at one of the input terminals, in which the transient voltage is caused by an initial coupling of that input terminal to the battery; detect a condition in which the switch has been closed for longer than a threshold amount of time; close the switch responsive to the detected ESD event; and open the switch responsive to the detected transient voltage or the detected condition.

20 Claims, 11 Drawing Sheets

ELECTROSTATIC DISCHARGE (ESD) PROTECTION CIRCUIT WITH DISABLE FEATURE BASED ON HOT-PLUG CONDITION DETECTION

CROSS-REFERENCE TO RELATED APPLICATION

This application is a divisional of application Ser. No. 16/904,461 filed Jun. 17, 2020, currently pending, and claims priority to U.S. Provisional Application No. 62/862,321, filed Jun. 17, 2019, which is hereby incorporated herein by reference in its entirety.

BACKGROUND

The proliferation of electronic devices and integrated circuit (IC) technology has resulted in the commercialization of IC products. As new electronic devices are developed and IC technology advances, new IC products are commercialized. One example IC product that is needed in electronic devices is a battery management system (BMS) module with one or more IC circuits. An example BMS module is able to perform battery cell monitoring operations and cell balancing operations In one example scenario, a battery-powered electrical system (e.g., an electric vehicle) includes numerous battery cells in the form a battery pack. An example battery pack includes a large number of Li-Ion cells connected in series. Each of the battery cells of the battery pack is individually monitored by one or more BMS modules to ensure that the battery pack is operating as expected. Each BMS module is connected to a number of battery cells via a connector and a wire harness, and may include one of more ICs to perform battery cell monitoring operations, cell balancing operations. During the assembly of the BMS module, the IC's must be able to withstand ESD events. Also, during assembly of an electric vehicle, the battery pack is connected to the BMS modules via a hot-plug operation. Due to the mechanical nature of the assembly operation, a BMS module IC monitoring a specific group of battery cells can have any of the battery cells connected to its pins in any sequence. This initial connection can falsely trigger ESD protection operations, resulting in large currents flowing through internal IC nodes of ESD protection circuitry. Instead of discharging the energy of an ESD event, the ESD protection circuitry will attempt to discharge energy of one or more battery cells connected after the hot-plug operation. Such an attempt to discharge a battery cell by the ESD protection circuitry of a BMS module IC may cause an instantaneous or a latent failure of the BMS module IC as the ESD protection circuitry is not intended to stay on for more than a short period of time (in the range of microseconds).

SUMMARY

In accordance with at least one example embodiment of the description, a circuit comprises input terminals adapted to be coupled to a battery; a ground terminal; and an electrostatic discharge (ESD) protection circuit coupled to the input terminals. The ESD protection circuit includes: a switch coupled between the ground terminal and the input terminals; and a control circuit coupled to the input terminals and to the switch. The control circuit is configured to: detect an ESD event at one of the input terminals; detect a transient voltage at one of the input terminals, in which the transient voltage is caused by an initial coupling of that input terminal to the battery; detect a condition in which the switch has been closed for longer than a threshold amount of time; close the switch responsive to the detected ESD event; and open the switch responsive to the detected transient voltage or the detected condition.

In accordance with at least one example embodiment of the description, an ESD protection circuit comprises: a switch adapted to be coupled between input terminals and a ground terminal of an integrated circuit (IC); and a control circuit adapted to be coupled to the input terminals and to the switch. The control circuit is configured to: detect a set of parameters including: a first parameter indicating an ESD event; a second parameter indicating a transient voltage at one of the input terminals, in which the transient voltage is caused by an initial coupling of that input terminal to a battery; a third parameter indicating a condition in which the switch has been closed for longer than a threshold amount of time; close the switch responsive to the first parameter; and open the switch responsive to the second or third parameters.

In accordance with at least one example embodiment of the description, a battery-powered electrical system comprises: a battery module having a plurality of battery cells; a connector coupled to each of the plurality of battery cells; and a printed circuit board (PCB). The PCB has: a plug interface compatible with the connector; and a circuit coupled to the plug interface. The circuit includes an electrostatic discharge (ESD) protection circuit configured to detect a condition indicating the plug interface is being initially coupled to the connector and to stop an ESD protection operation responsive to the detected condition.

DETAILED DESCRIPTION

Figure 1:
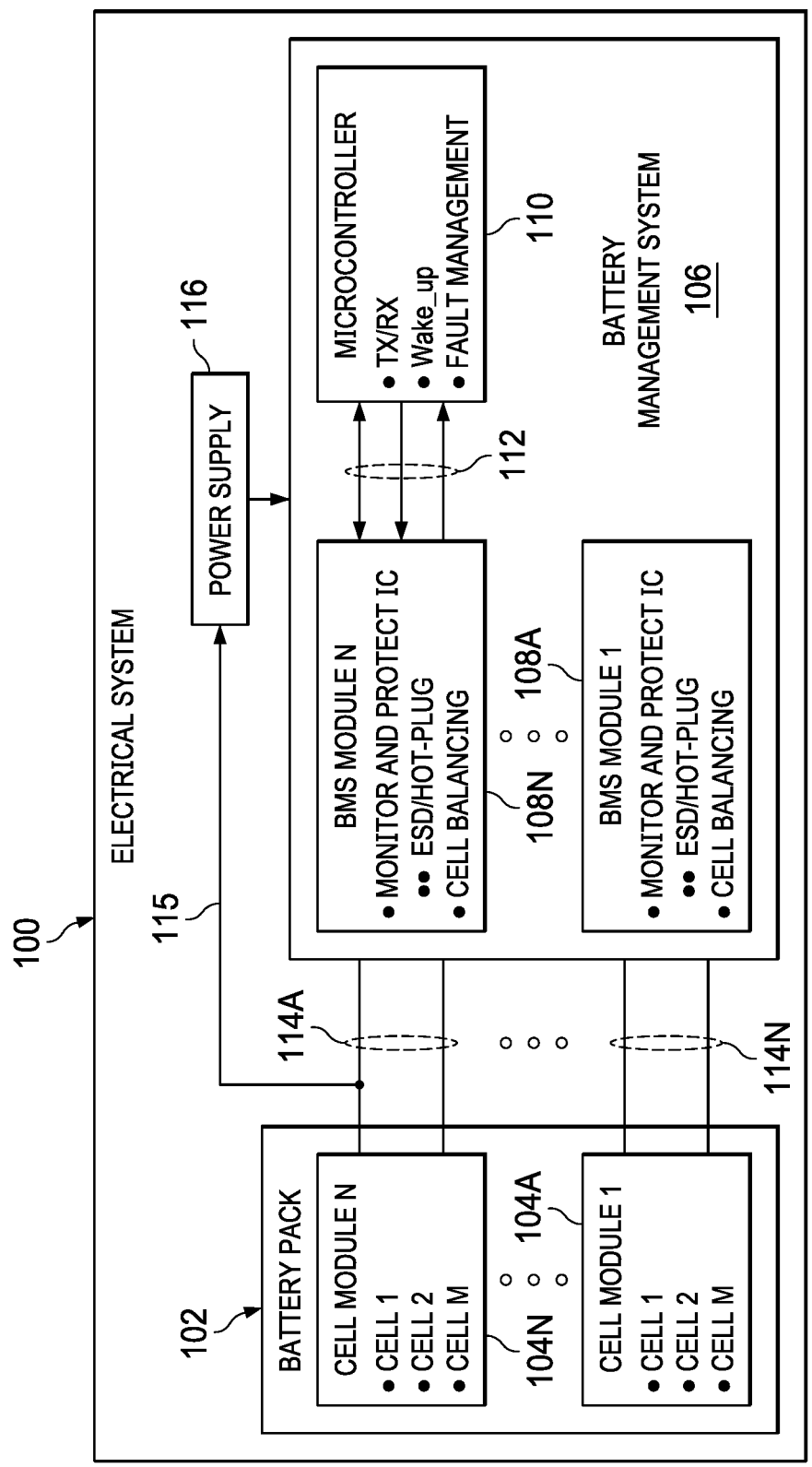
FIG. 1 is a block diagram showing an electrical system in accordance with an example embodiment.

Described herein is an electrostatic discharge (ESD) protection circuit with a disable feature based on hot-plug condition detection. As used herein, "hot-plug" or "hot-plug operations" refer to the initial mechanical connection of a battery pack to a battery management system (BMS) module. When used in a BMS module integrated circuit (IC), the described ESD protection circuit with a disable feature based on hot-plug condition detection solves the problem of the ESD protection circuit being unintentionally activated by a hot-plug operation. Instead of staying on in an attempt to discharge the energy of a battery connected after the hot-plug operation, the ESD protection circuit will be disabled for a time interval to stop or cancel an ESD protection operation in response to hot-plug condition detection. After the time interval, the ESD protection circuit may be enabled or available again. In this manner, the ESD protection circuit will not be damaged by the hot-plug operation, thus extending the life and/or reliability of a BMS module IC.

For the described ESD protection circuit, several parameters can be monitored and used to detect a hot-plug condition. Without limitation, these parameters include a first slew rate at a first input terminal of a BMS circuit and a second slew rate at a second input terminal of a BMS circuit. In some example embodiments, the first and second input terminals of the BMS circuit are coupled to a plug interface configured to connect battery cells of a battery pack to the BMS circuit after completion of a hot-plug. Another example parameter is first timing parameter and/or a second timing parameter greater than the first timing parameter, where the first and second timing parameters indicate a duration of ESD operations. Another example parameter is a failsafe parameter that includes when the BMS circuit is powered off or on. When the failsafe parameter indicates the BMS circuit is powered on, ESD protection operations and hot-plug operations are not needed. When the failsafe parameter indicates the BMS circuit is powered off, ESD protection operations and the disable feature based on hot-plug condition detection apply.

The described ESD protection circuit provides a solution that differentiates between a hot-plug condition and a real ESD event. In some example embodiments, the described ESD protection circuit does not have to rely on any specific cell connection sequencing or external application circuits to withstand the initial hot-plug condition. Advantageously, the described ESD protection circuit lowers the cost of external application circuit components (e.g., smaller filter capacitors can be used) and uses simple ESD protection circuitry. In one example embodiment, the described ESD protection circuit is disabled for a short period of time when a hot-plug condition is detected. Also, the described ESD protection circuit does not affect the ESD protection operation in response to a real ESD event. To provide a better understanding, various ESD protection circuit options (with ESD protection and a disable feature based on hot-plug condition detection), BMS module and related IC options, and battery-powered electrical system options are described using the figures as follows.

FIG. 1 is a block diagram showing an electrical system 100 in accordance with an example embodiment. In the example of FIG. 1, the electrical system 100 is a battery-powered electrical system with a battery pack 102 with a plurality of battery cell modules 104A-104N, where each of the plurality of battery cell modules 104A-104N includes a plurality of battery cells (e.g., battery cells 1-M). In different examples, the number of battery cell modules in a battery pack (e.g., the battery pack 102) may vary. Also, in different examples, the number of battery cells in a battery cell module (e.g., the battery cell modules 104A-104N) may vary. In some example embodiments, an electric vehicle includes the electrical system 100.

In FIG. 1, the battery cell modules 104A-104N of the battery pack 102 are coupled to respective BMS modules 108A-108N of a BMS 106 via connection interfaces 114A-114N. In one example embodiment, the connection interfaces 114A-114N include wires, pins, plugs, connectors and/or other mechanical connection options. As shown, an additional connector 115 related to the connection interface 114N may be used to provide power to a power supply 116, where the power supply 116 supplies power the BMS 106 after a hot-plug condition.

In FIG. 1, the BMS modules 108A-108N are able to communicate with each other and with a microcontroller 110 via a signaling interface 112. In one example, the signaling interface 112 includes a Universal Asynchronous Receiver/Transmitter (UART) interface for sending data to and receiving data from the BMS modules 108A-108N. The microcontroller 110 may also perform wake-up operations and/or fault management operations. Once the BMS 106 is successfully coupled to the battery pack 102, the BMS 106 provides power to loads 118 (e.g., control circuits, sensors, motors) of the electrical system 100.

In different scenarios, a hot-plug of the battery pack 102 to the BMS 106 and related BMS modules 108A-108N can trigger false ESD events. To account for this possibility, each of the BMS modules 108A-108N may include an ESD protection circuit as described herein, where the ESD protection circuit is disabled to stop or cancel an ESD protection operation in response to hot-plug condition detection. In this manner, even if an ESD event is unintentionally triggered when a hot-plug occurs, the ESD protection circuit will be able to stop or cancel ESD protection operations for a time interval before damage to components of the ESD protection circuit occurs. After the time interval the hot-plug condition is no longer present, and the ESD protection circuit is enabled again.

Figure 2A:
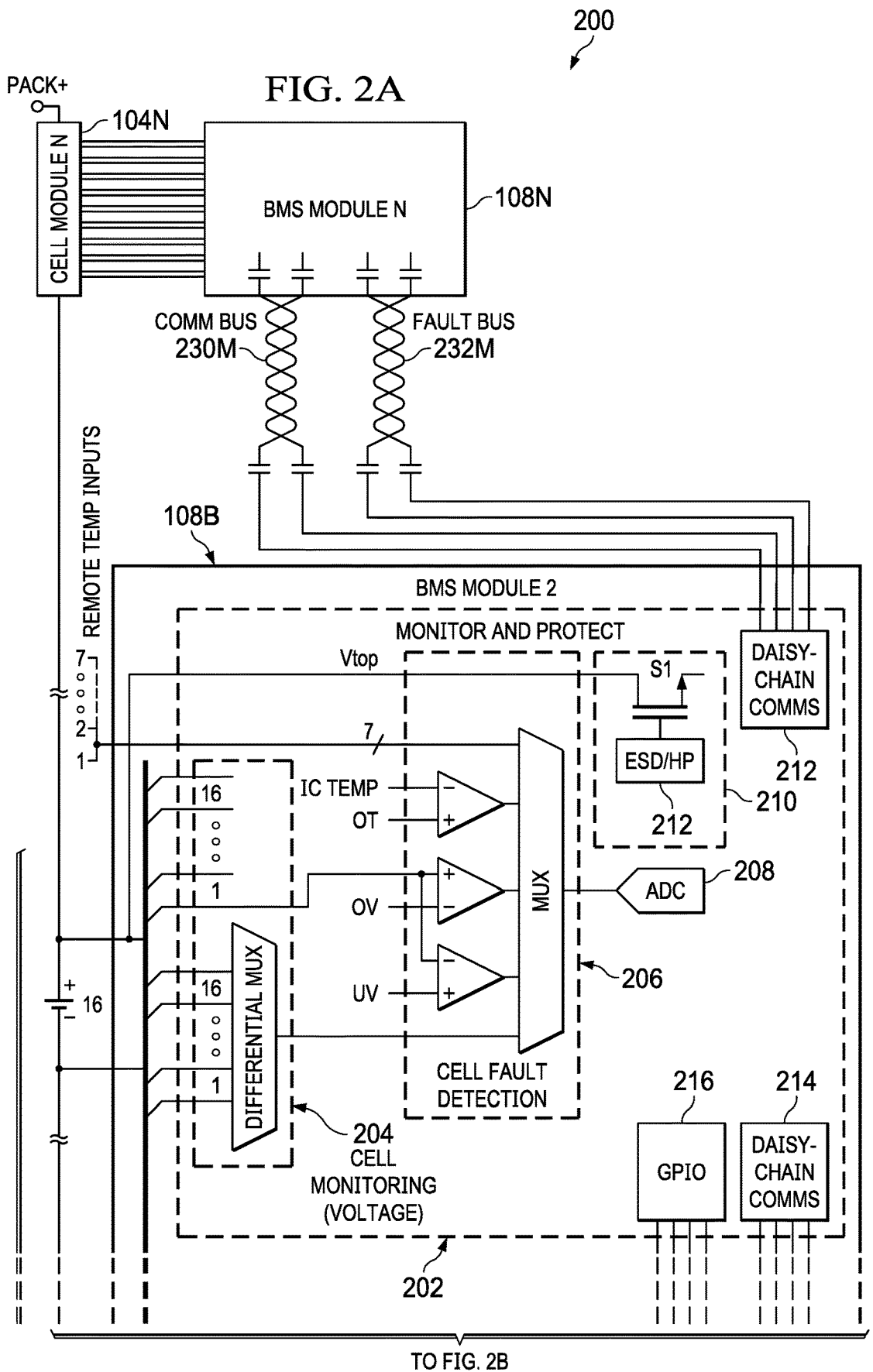
FIGS. 2A and 2B are a diagram showing an arrangement with the battery cell modules and related battery management system (BMS) modules in accordance with an example embodiment.
Figure 2B:
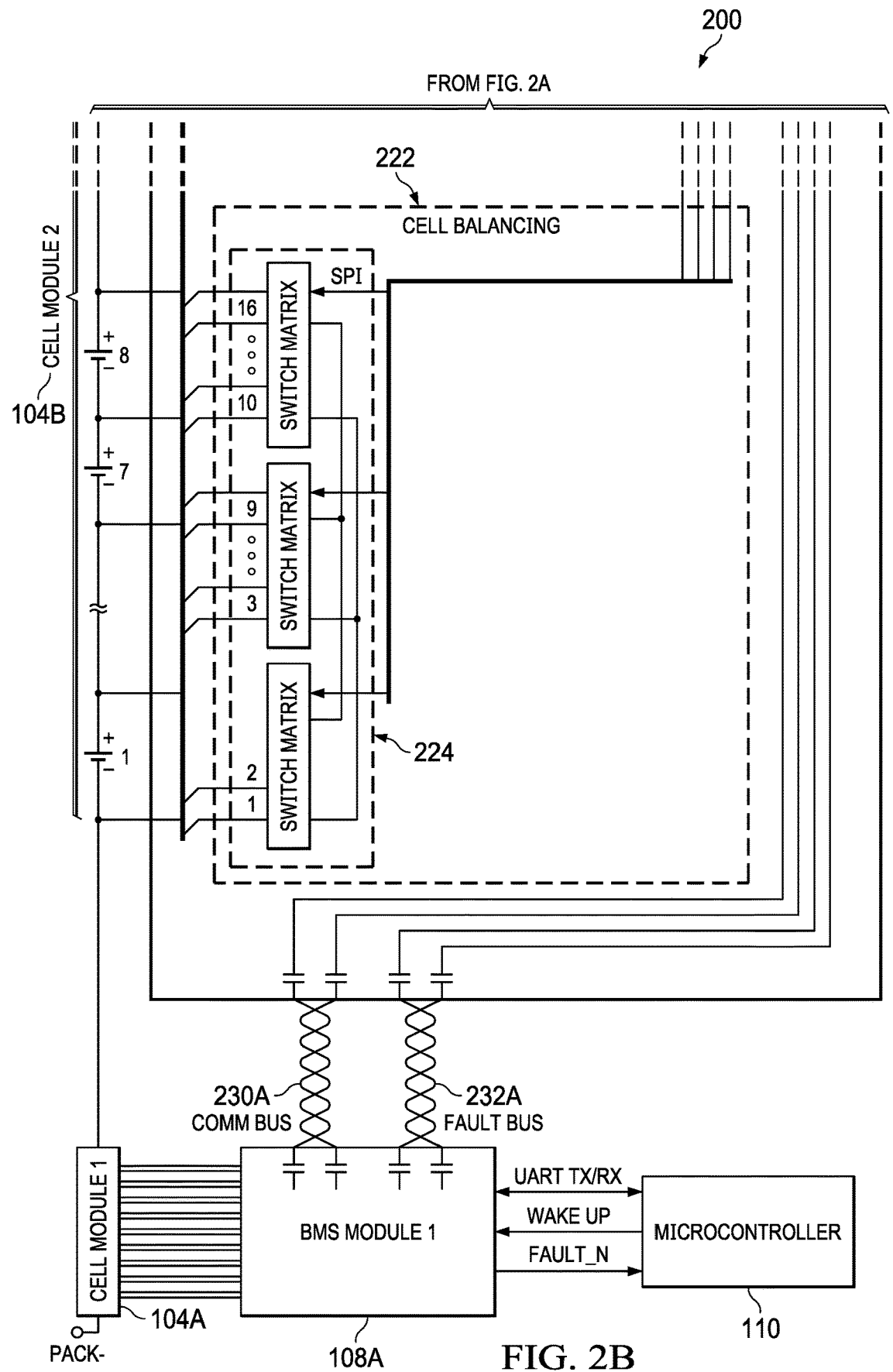

FIGS. 2A and 2B are a diagram showing an arrangement 200 with the battery cell modules 104A-104N and related BMS modules 108A-108N of FIG. 1 in accordance with an example embodiment. In the arrangement 200, the battery cell modules 104A-104N are in series and form a battery pack (e.g., the battery pack 102 in FIG. 1). Each of the battery cell modules 104A-104N is coupled to a respective BMS module 108A-108N in a manner that enables each battery cell of each battery module to be monitored without regard to voltage and current levels. Note: in FIGS. 2A and 2B, the mechanical connection (e.g., a plug interface and related pins) between the battery cell modules 104A-104N and the BMS modules 108A-108N is not represented. This mechanical connection can be represented as a set of switches (see e.g., the set of switches 304 in FIGS. 3A-3C).

As shown in FIGS. 2A and 2B, the BMS modules 108A-108N are coupled to each other via communication bus portions 230A-230M and fault bus portions 232A-232M. Also, the BMS modules 108A-108N are coupled to an isolated power line 240 (e.g., a 12V power line), which powers the BMS modules 108A-108N. Also, the BMS modules 108A-108N are coupled to the microcontroller 110 at the BMS module 108A. The microcontroller 110 is represented as supporting data transmission to and data reception from the BMS modules 108A-108N using a UART interface. Also, wake-up operations (WAKEUP signaling from the microcontroller 110 to the BMS modules 108A-108N) and fault operations (FAULT_N signaling from the BMS modules 108A-108N to the microcontroller 110) are performed by the microcontroller 110 as needed.

In the arrangement 200 of FIGS. 2A and 2B, the BMS module 108B is represented in some detail, where the same or similar components are included in each of the BMS modules 108A-108N. As shown, the BMS module 108B includes a monitor and protect circuit 202 that includes to one or more ICs. The monitor and protect circuit 202 includes a differential multiplexer network 204 coupled to the battery cells of the battery cell module 108B as well as a cell fault detection circuit 206 coupled to the differential multiplexer network 204. The cell fault detection circuit 206 includes circuitry (e.g., comparators, reference signals, and a multiplexer) to detect fault conditions (e.g., an overtemperature condition, an overvoltage condition, and an undervoltage condition) for each battery cell of the battery cell module 104B and to provide related signaling. In the example of FIGS. 2A and 2B, the output of the cell fault detection circuit 206 is provided to an analog-to-digital converter (ADC) to generate digital fault signals as needed. The digital fault signals and possibly other signals (e.g., from the cell balancing circuit 222) are conveyed via daisychain communication interfaces 212 and 214 from the BMS module 108B to other the BMS modules 108A-108N and/or the microcontroller 110. As shown, the monitor and protect circuit 202 also includes a general-purpose input/output (GPIO) interface 216 for digital communications with the cell balancing circuit 222.

In the example of FIGS. 2A and 2B, the monitor and protect circuit 202 also includes a ESD protection circuit 210 with a switch S1 (e.g., represented a bipolar transistor in FIG. 2A) and a control circuit 212 configured to perform ESD protection operations with a disable feature based on hot-plug condition detection as described herein. In an example operation, the ESD protection circuit 210 initiates ESD protection operations by turning S1 on in response to detecting a fast voltage transient for VTOP (the voltage at the internal IC connector supplied by the top battery cell of the cell module 108B). When S1 is turned on, the VTOP voltage will be grounded. Such a scenario typically could happen before the battery pack and related connectors are plugged into the BMS modules 108A-108N. The fast voltage transient for VTOP may also occur in response to a hot-plug operation as described herein (e.g., during assembly of the battery pack and the BMS modules 108A-108N). If a hot-plug operation were to initiate ESD protection operations of the ESD protection circuit 210, the ESD protection circuit 210 is configure to detect the hot-plug condition and respond by disabling or stopping ESD protection operations by opening S1. The disable feature in response to hot-plug condition detection protects components the ESD protection circuit 210, such as S1, from dissipating energy over a long period of time. Without the disable feature, damage to S1 could occur from a hot-plug condition (S1 attempts to discharge a battery). If S1 were damaged, VTOP could be grounded, which affects functionality of the BMS module 108B. Thus, the described disable feature of the ESD protection circuit 210 is important to ensure proper functionality of the BMS module 108B.

In the arrangement 200 of FIGS. 2A and 2B, the cell balancing circuit 222 includes a transformer 226 (e.g., to provide up to +/−5 A) coupled to the isolated power line 240. The cell balancing circuit 222 also includes power supplies 228 to provide a desired set of voltage values (e.g., 12V and 12 VF). The outputs of the transformer 226 and/or the power supplies 228 are used to power a switch matrix array 224 coupled to the battery cells of the battery cell module 104B. The operations of the switch matrix array 224 are controlled by communications from the monitor and protect circuit 202 receive via the GPIO interface 216. To summarize, cell balancing operations of the cell balancing circuit 222 ensures that all battery cells of the battery cell module 104B are configured to be fully charged even if one or more of the battery cells reach a full charge before other battery cells.

Figure 3A:
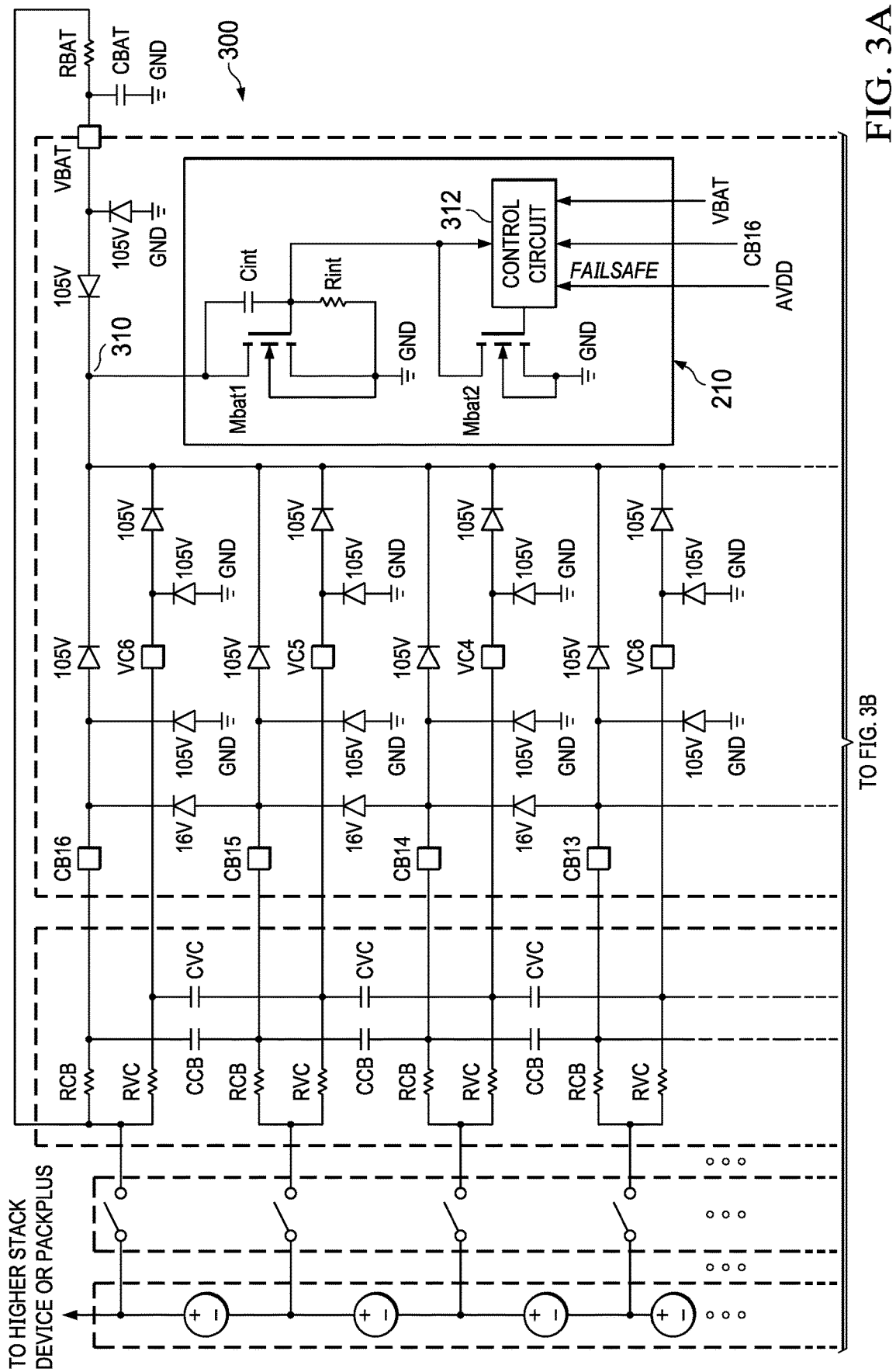
FIGS. 3A-3C are a schematic diagram showing an arrangement of components of a battery-operated electrical system in accordance with an example embodiment.
Figure 3B:
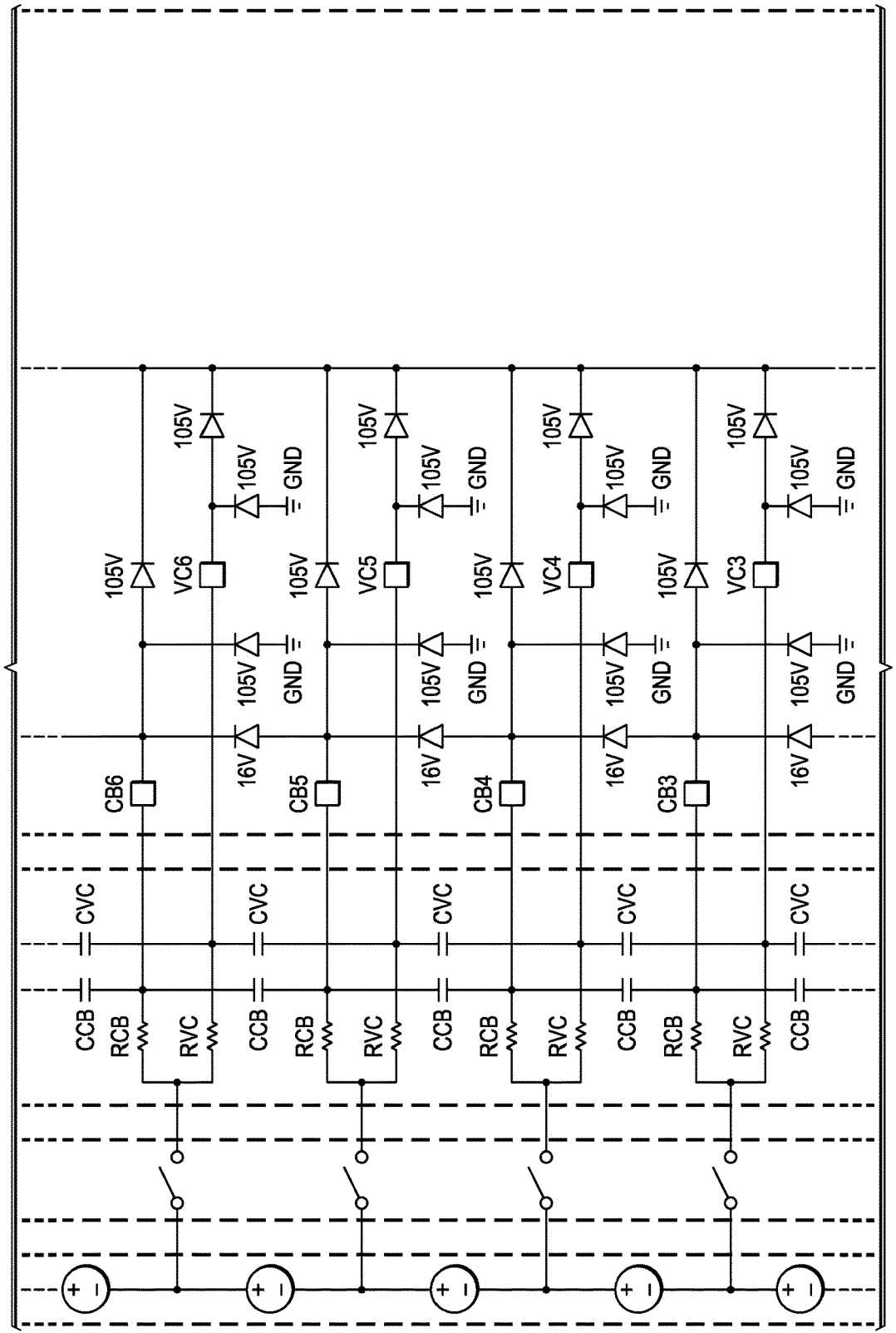
Figure 3C:
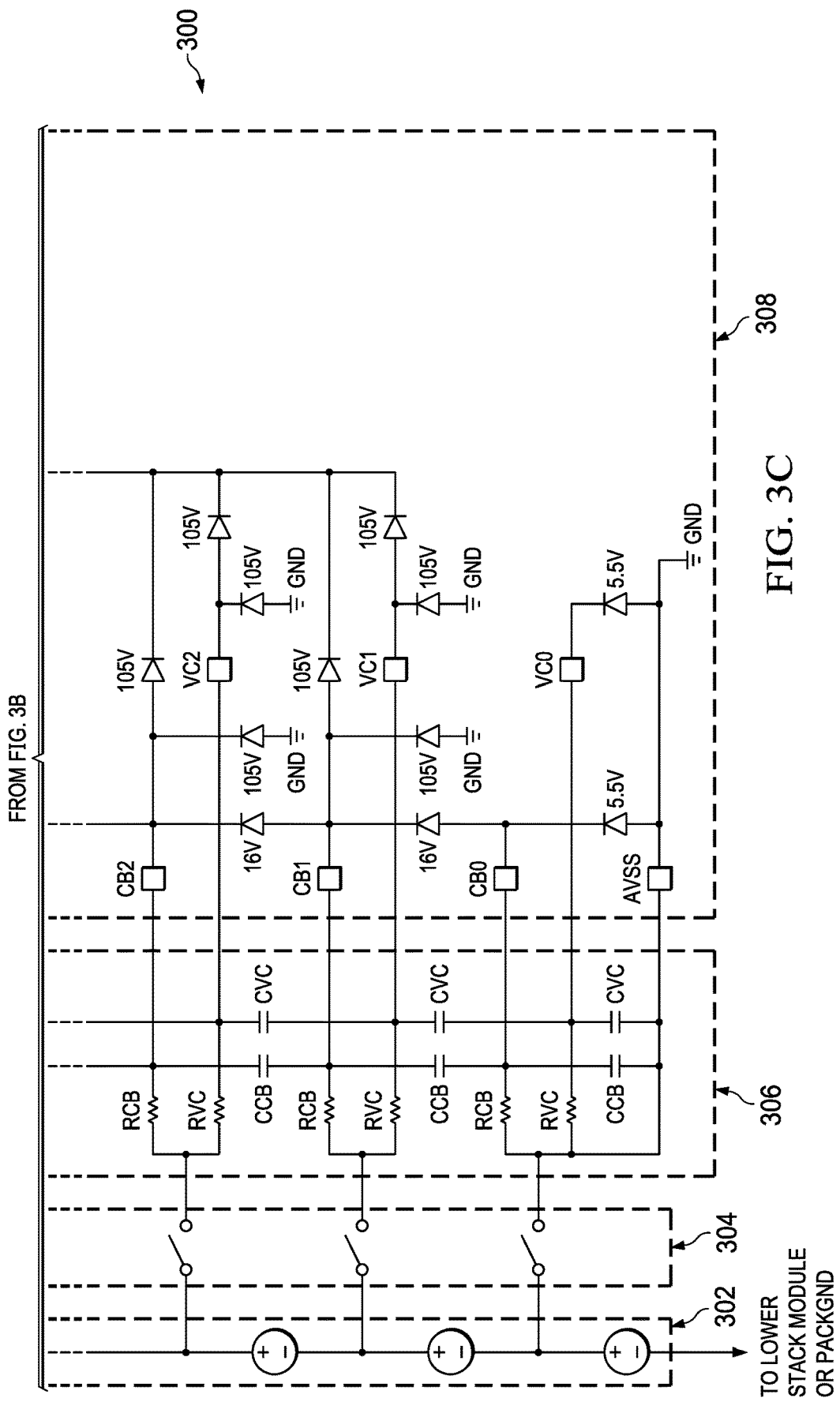

FIGS. 3A-3C is a schematic diagram showing an arrangement 300 of components of a battery-operated electrical system (e.g., the electrical system 100 in FIG. 1) in accordance with an example embodiment. In FIGS. 3A-3C, the arrangement 300 includes a battery cell module 302 (e.g., any of the battery cell modules 108A-108N) coupled to a BMS module IC 308 via a set of switches 304 and a set of filters 306. More specifically, the set of switches 304 represent a mechanical connection (e.g., plugs, pins, and/or other mechanical connectors) that can result in a hot-plug condition as described herein. In the example of FIGS. 3A-3C, the set of filters 306 includes resistors (RVC and RCB) and capacitors (CCB and CVC) for each battery cell to filter unwanted signals from the arrangement 300. The BMS module IC 308 is one IC of a BMS module (e.g., any one of the BMS modules 108A-108N). Specifically, the BMC module IC 308 may be part of a monitor and protect circuit (e.g., the monitor and protect circuit 202 in FIG. 2A) for a BMS module.

As shown, the BMS module IC 308 includes a plurality of input pins (labeled CB1-CB16, VC0-VC6) coupled to the battery cells of the battery cell module 302 via the set of filters 306. The BMS module IC 308 also includes a set of diodes to control the direction of current flow from the input pins towards the node 310. The BMS module IC 308 also includes a VBAT input pin coupled to the top battery cell of the battery cell module 302 via an RC filter formed by a resistor (RBAT) and a capacitor (CBAT). As shown, diodes control the direction of current flow from the VBAT input pin towards the node 310.

In the example of FIGS. 3A-3C, the ESD protection circuit 210 is coupled to the node 310 and includes a switch Mbat1 between the node 310 and ground. As shown, Mbat1 may be an n-type metal-oxide semiconductor (NMOS) transistor. The ESD protection circuit 210 also includes a capacitor (Cint) and a resistor (Rint), where Cint is between the gate and drain terminals of Mbat1, and where Rint is between the gate and source terminals of Mbat1. The ESD protection circuit 210 also includes a second switch Mbat2 between the gate terminal of Mbat1 and ground. In the example of FIGS. 3A-3C, a control circuit 312 is coupled to the gate terminals of Mbat1 and Mbat2 and provides separate control signals to the gate terminals. When an ESD event is detected as described herein, the control circuit 312 provides a control signal to turn Mbat1 on to connect the node 310 to ground and thus discharge the ESD energy to ground. If the detected ESD event is not correct and is due to hot-plug condition, the control circuit 312 is able to detect the hot-plug condition and provide a control signal to turn Mbat2 on, which connects the gate terminal of Mbat1 to ground and thus disables the ESD protection operations.

The control circuit 312 may detect the hot-plug condition based on one or more monitored parameters. In the example of FIGS. 3A-3C, a FAILSAFE signal is provided to the control circuit 312, where FAILSAFE indicates whether or not the BMS module IC 308 is powered or not. If FAILSAFE is asserted, the BMS module IC 308 is indicated to be powered and thus a hot-plug condition is not present. On the other hand, if FAILSAFE is not asserted, the BMS module IC 308 is indicated to be not powered and thus a hot-plug condition may be present. Thus, the FAILSAFE signal is a monitored parameter than can be used to determine that a hot-plug condition is not present. If FAILSAFE signal is de-asserted, a hot-plug condition may be present, which is detectable using at least one additional monitored parameter.

In one example, the control circuit 312 monitors a first slew rate parameter indicating at least a first slew rate is detected at input pin CB16 (i.e., a fast transient occurred at CB16) and monitors a second slew rate parameter indicating at least a second slew rate is detected at input pin VBAT (i.e., a fast transient occurred at VBAT). If both first and second slew rate parameters are present, it is an indication of a hot-plug condition. In this example, the control circuit 312 also internally monitors a first timing parameter indicating Mbat1 has been on for at least a first time interval (e.g., 100 ns). If the first and second slew rate parameters indicate fast transients at CB16 and VBAT, the first timing parameter indicates Mbat1 has been on for at least the first time interval, and FAILSAFE is de-asserted, then the control circuit 312 identifies a fast hot-plug condition and responds by turning Mbat2 on, which turns Mbat1 off.

In another example, a hot-plug condition may exist that does not result in the first and second slew rate parameters indicating fast transients at CB16 and VBAT. In this example, the control circuit 312 internally monitors a second timing parameter indicating Mbat1 has been on for at least a second time interval (e.g., 9 us). Thus, even if the first and second slew rate parameters do not indicate fast transients at CB16 and VBAT, the second timing parameter being true and FAILSAFE being de-asserted can be used to detect a slow hot-plug condition. In response to detecting a slow hot-plug condition, the control circuit 312 responds by turning Mbat2 on, which turns Mbat1 off.

Figure 4A:
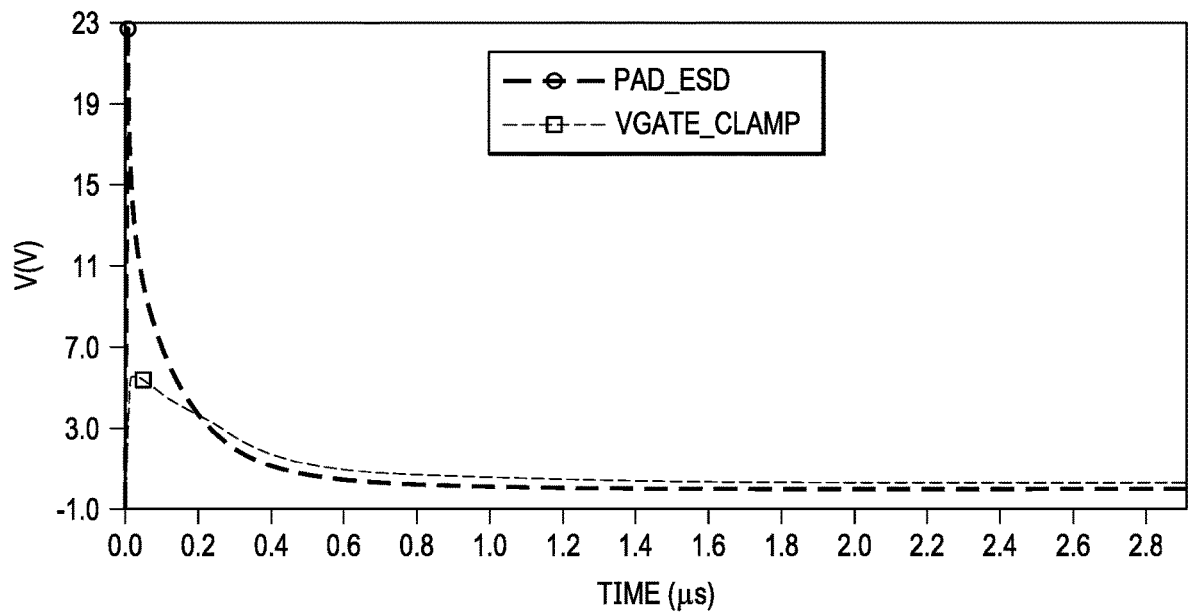
FIGS. 4A and 4B are graphs showing electrostatic discharge (ESD) voltage and current waveforms at the integrated circuit (IC) ESD protection circuit as function of time in accordance with an example embodiment.
Figure 4B:
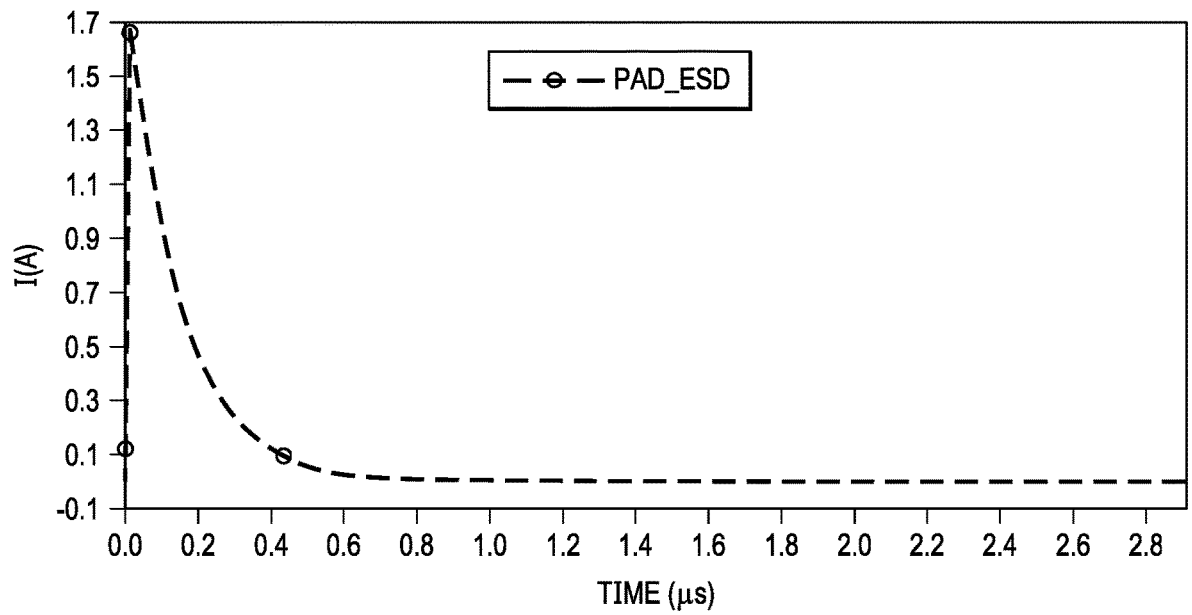

FIGS. 4A and 4B are graphs 400 and 410 showing ESD voltage and current waveforms as function of time in accordance with an example embodiment. In the graph 400, various ESD voltage waveforms are represent. As shown in graph 400, the ESD voltage waveforms have a pulse shape with a fast initial slew rate and a slower downwards slew rate, where the maximum value of ESD voltage waveforms may vary. In graph 410, an ESD current waveform is represented, where the ESD current waveform also has a pulse shape. The total area under the curve of the ESD current waveform indicates the total amount of energy of an ESD event. As represented in graphs 400 and 410, the ESD voltage and current waveforms are fast pulses that are reduced to low levels in less than 1 us.

Figure 4C:
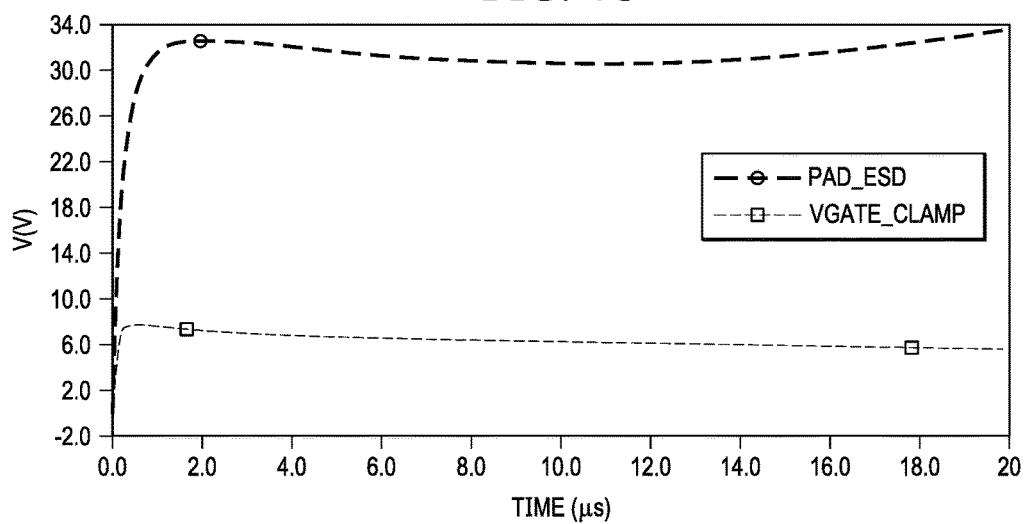
FIGS. 4C and 4D are graphs showing hot-plug voltage and current waveforms at the IC ESD protection circuit without the proposed ESD protection circuit with a disable feature based on hot-plug condition detection as described herein.
Figure 4D:
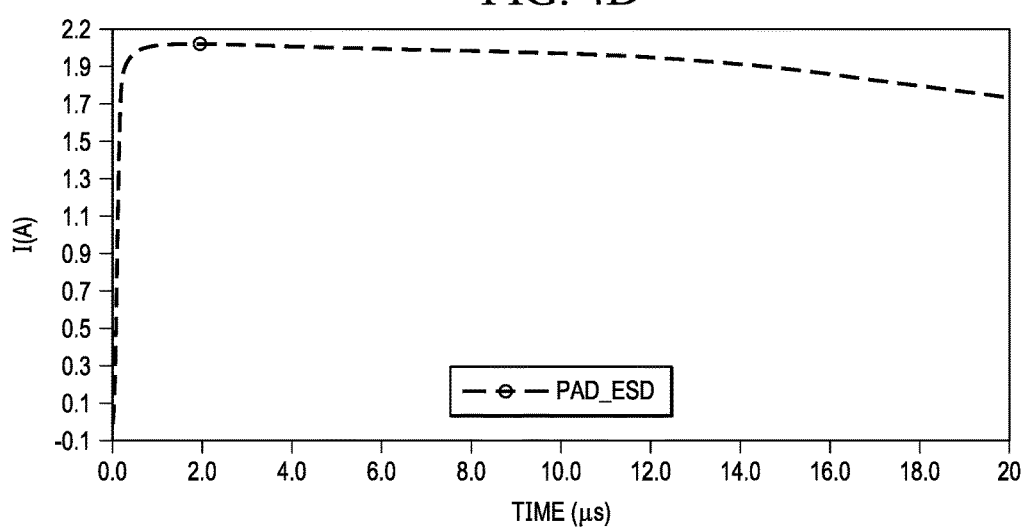

FIGS. 4C and 4D are graphs 420 and 430 showing hot-plug voltage and current waveforms without the described ESD protection circuit with a disable feature based on hot-plug condition detection as described herein. As shown in graph 430, the hot-plug voltage waveforms have fast initial slew rate and a slower downwards slew rate, where the fast initial slew rate may trigger ESD event detection by an ESD protection circuit (e.g., the ESD protection circuit 210 in FIGS. 2 and 3). Also, the hot-plug voltage waveforms settle to a voltage level greater than zero (e.g., depending on the battery being connected by a hot-plug). In the graph 430, the hot-plug current waveform does not fall slowly due to the battery being connected. With the hot-plug current waveform of graph 430, components of an ESD protection circuit (e.g., S1 in FIG. 2A, or Mbat1 in FIG. 3A) could be damaged by excessive power dissipation (as represented by the area under the hot-plug current waveform).

Figure 5:
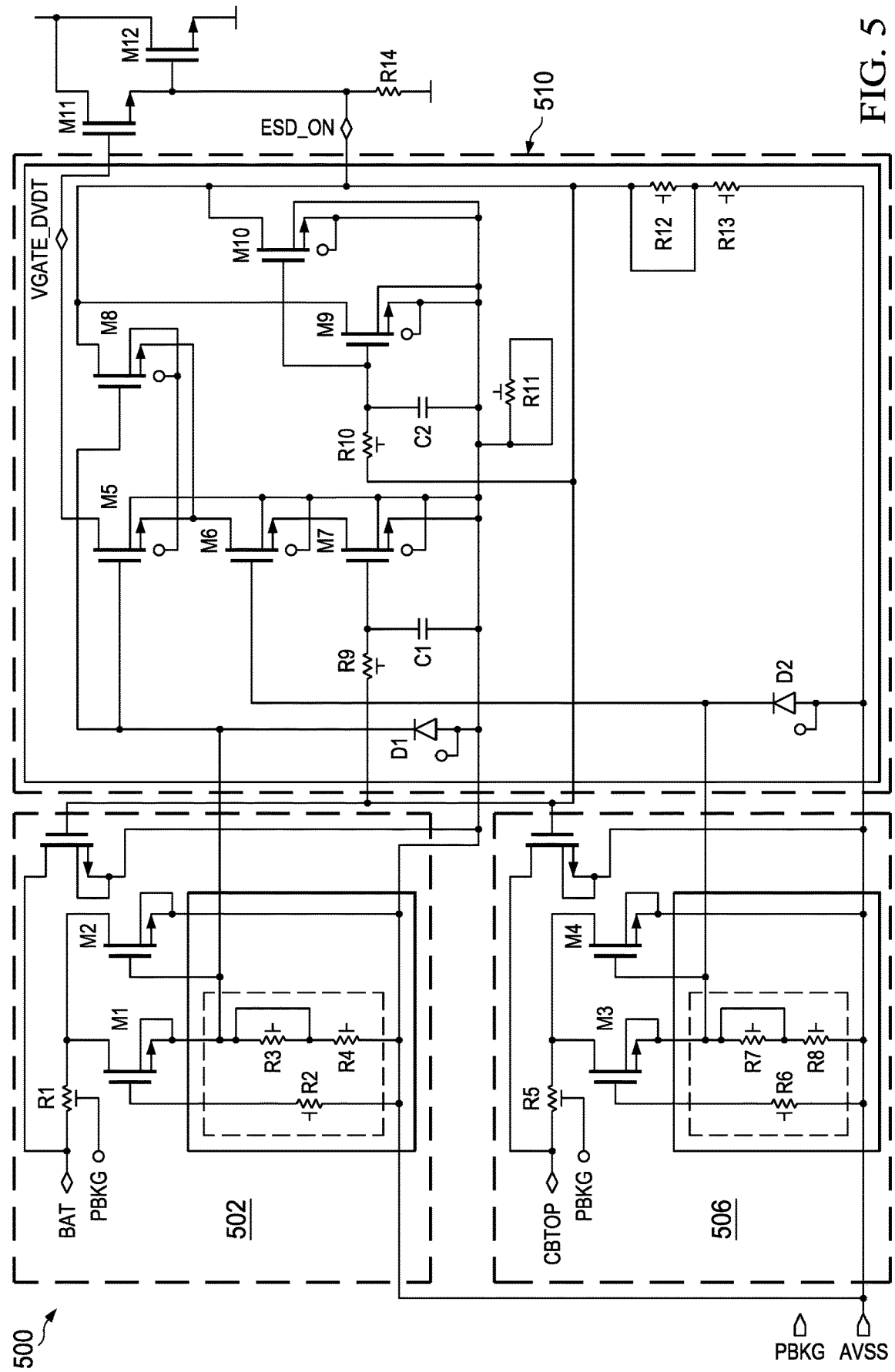
FIG. 5 is a schematic diagram showing a control circuit for an ESD protection circuit with a disable feature based on hot-plug condition detection in accordance with an example embodiment.

FIG. 5 is a schematic diagram showing a control circuit 500 (e.g., an example of the control circuit 312 in FIG. 3A) for an ESD protection circuit (e.g., the ESD protection circuit 210 in FIGS. 2 and 3) with a disable feature based on hot-plug condition detection in accordance with an example embodiment. As shown, the control circuit 500 includes a first slew rate detection circuit 502 coupled to a BAT input pin (an example of VBAT in FIG. 3A). In the example of FIG. 5, the first slew rate detection circuit 502 includes an arrangement of transistors M1 and M2, and resistor R1-R4 as shown. The control circuit 500 also includes a second slew rate detection circuit 506 coupled to a CBTOP input pin (an example of CB16 in FIG. 3A), where the second slew rate detection circuit 506 includes an arrangement of transistors M3 and M4, and resistor R5-R8 as shown. In operation, the first and second slew rate detection circuits 502 and 504 monitor the first and second slew rate parameters described herein. If either of the first or second slew rate parameters monitored by the first and second slew rate detection circuits 502 and 506 indicates a fast transient condition at BAT or CBTOP, an ESD_ON signal is asserted. As shown, the ESD_ON signal is passed by control and delay circuitry 510 coupled to the first and second slew rate detection circuits 502 and 506 as a control signal to M12 (e.g., an example Mbat1 in FIG. 3A) to initiate ESD protection operations. As shown, the control and delay circuitry 510 also receives a separate signal (BATHOT) from the first slew rate detection circuit 502 to indicate a fast hot-plug condition is detected at the BAT input pin. The control and delay circuitry 510 also receives a separate signal (CBTOPHOT) from the second slew rate detection circuit 506 to indicate a fast hot-plug condition at the CBTOP input pin. In different examples, the circuitry used for the first and second slew rate detection circuits 502 and 506 may vary from what is shown in FIG. 5.

In the example of FIG. 5, the control and delay circuitry 510 includes an arrangement of transistors M5-M10 and resistors R9-R13 as shown. The control and delay circuitry 510 also includes diode D1 and D2, which operate as voltage clamps to limit the voltage at respective nodes of the control and delay circuitry 510. Also, M5-M8 and C1 are part of a first timing circuit (in the form of a resistor-capacitor (RC) circuit) configured to track when ESD_ON has been on for at least a first time interval (e.g., 100 ns) associated with a fast hot-plug condition. If ESD_ON has been on for at least the first time interface and CBTOPHOT and BATHOP are asserted, M5-M8 operate to assert VGATE_DVDT, which is a control signal to M11 (an example of Mbat2 in FIG. 3A). In the example of FIG. 5, a resistor R14 is positioned between the source terminal of M11 and ground, and between the gate terminal of M12 and ground. Also, M9, M10, R10, R11, and C2 of the control and delay circuitry 510 are part of a second timing circuit (another RC circuit) configured to track when ESD_ON has been on for at least a second time interval (e.g., 9 us) associated with a second hot-plug condition. If so, the output signal VGATE_DVDT is asserted to M11 (an example of Mbat2 in FIG. 3A) even if CBTOPHOT and BATHOP are not asserted. In some examples, the operations of the control and delay circuit 510 are combined with a failsafe parameter that indicates when a BMC module IC is powered on or not as described herein. In other examples, the control circuit 500 may vary with regard to the components used to monitor parameters indicating a hot-plug condition. Besides the monitorable parameters described herein, other possible monitorable parameters involved with hot-plug condition detection include temperature near the ESD protection switch and power dissipation at the ESD protection switch.

Figure 6:
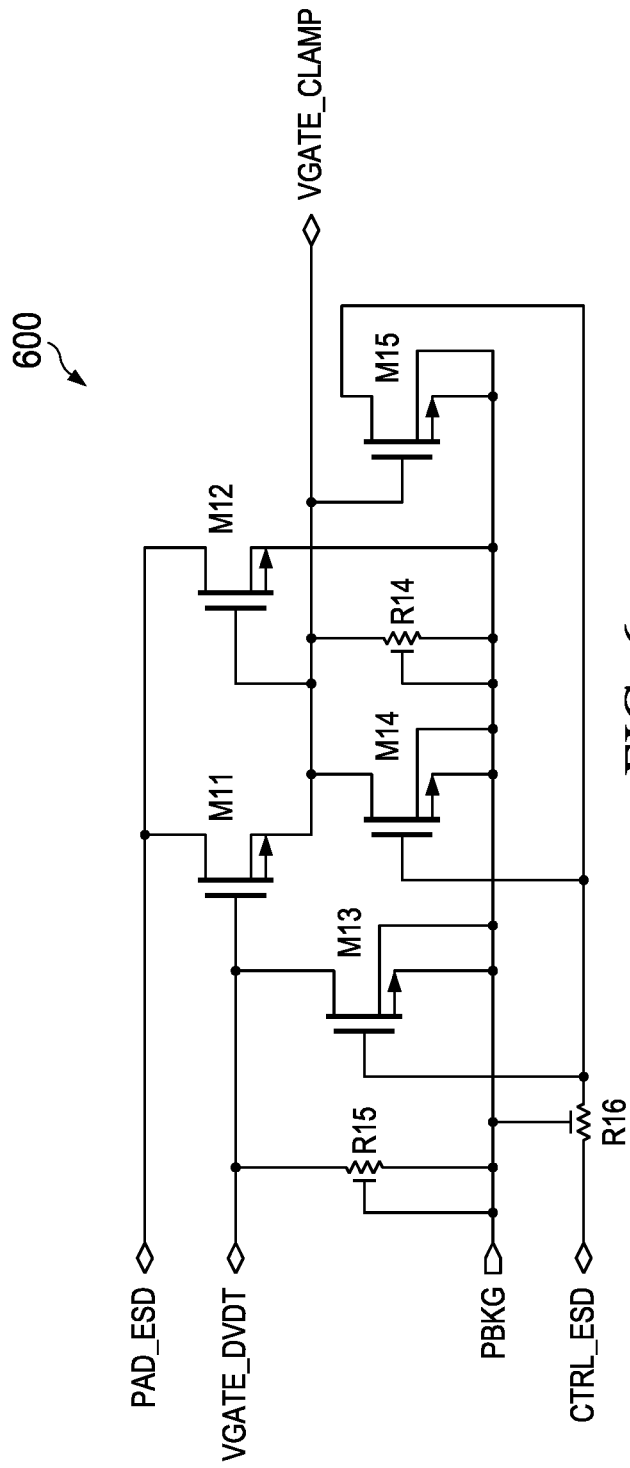
FIG. 6 is a schematic diagram showing a portion of an ESD protection circuit compatible with a disable feature based on hot-plug condition detection in accordance with an example embodiment.

FIG. 6 is a schematic diagram showing a portion 600 of an ESD protection circuit (e.g., a portion of the ESD protection circuit 210 separate from the control circuit 312 in FIG. 3A, or separate from the control circuit 500 in FIG. 5) compatible with the disable feature based on hot-plug condition detection in accordance with an example embodiment. As shown, the portion includes M11, M12, and R14 introduced in FIG. 5, where the gate terminal of M11 is coupled to the VGATE_DVDT signal output from the control circuit 500 in FIG. 5. Also, the gate terminal of M12 is coupled to VGATE_CLAMP, which is an example of ESD_ON in FIG. 5. As described above, with regard to FIG. 5, R14 is between the source terminal of M11 and ground. Also, R14 is between the gate terminal of M12 and a ground pin (BPKG). As shown, the drain terminals of M11 and M12 are coupled to a PAD_ESD pin, which represents an internal IC node such as node 310, CB16, VBAT, BAT, or CBTOP in the figures.

In FIG. 6, the portion 600 also includes various other transistors M13-M15 and resistors R15 and R16 as shown. Specifically, M13 controls when the gate terminal of M11 is grounded based on a failsafe control signal (CTRL_ESD). Also, M14 controls when the gate terminal of M12 is grounded based on CTRL_ESD. Also, M15 ensures that the ESD protection circuit is not turned off during an ESD event if CTRL_ESD signal has undesired transient noise caused by coupling of the ESD event energy to internal nodes. With the arrangement of portion 600, VGATE_CLAMP controls when M12 conducts current for ESD protection operations. When a hot-plug condition is signaled using VGATE_DVDT, M11 and M12 are turned off by the ESD protection circuit.

Figure 7:
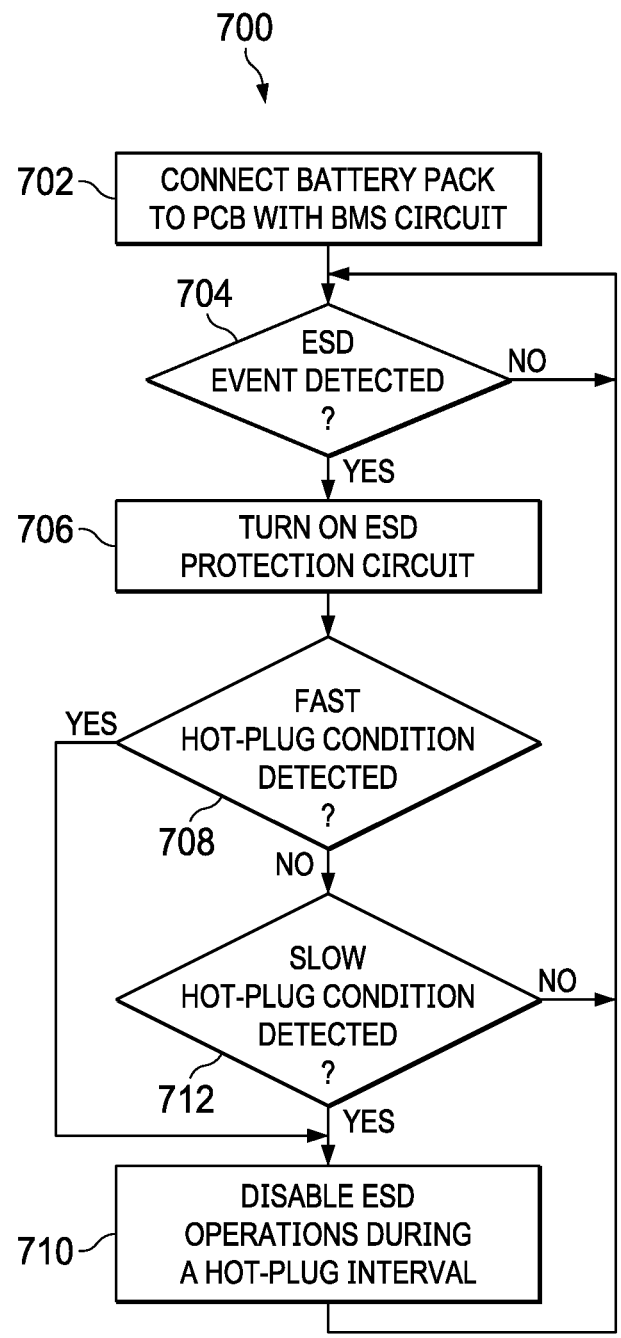
FIG. 7 is a flowchart showing a hot-plug condition monitoring method for a BMS circuit in accordance with an example embodiment.

FIG. 7 is a flowchart showing a hot-plug condition monitoring method 700 for a BMS circuit (e.g., an IC of any of the BMS modules 108A-108N in FIG. 1, an IC related to the monitor and protect circuit 202 in FIG. 2A, or the BMS module IC 308 in FIGS. 3A-3C). In different examples, the plug condition monitoring method 700 is performed by an ESD protection circuit (e.g., part of an IC within any of the BMS modules 108A-108N in FIG. 1, part of an IC related to the monitor and protect circuit 202 in FIG. 2A, the ESD protection circuit 210 in FIGS. 2 and 3, or an ESD protection circuit with the control circuit 500 in FIG. 5 and/or the ESD protection circuit portion 600 in FIG. 6). As shown, the method 700 includes connecting a battery pack to a BMS module at block 702. If an ESD event is not detected (determination block 704), the method 700 continues monitoring for an ESD event. If an ESD event is detected (determination block 704), the ESD protection circuit is turned on to discharge energy at an internal IC node at block 706 (e.g., node 310, CB16, VBAT, BAT, CBTOP in the figures). If a fast hot-plug condition is not detected (determination block 708) after ESD protection operations are started at block 706, the method 700 monitors for a slow hot-plug condition (determination block 712). If a fast hot-plug or slow hot-plug condition are detected by decision blocks 708 or 712, ESD protection operations are disabled during a hot-plug interval at block 710 (effectively canceling the ESD protection operations initiated at block 706). From decision block 712 or block 710, the method returns to block 704 to continue monitoring for ESD events.

In the method 700, a fast hot-plug condition at block 708 can be detected based on slew rate parameters at two different IC pins indicating a fast transient as described herein. Also, a first timing parameter indicating how long ESD protection operations (e.g., S1 on in FIG. 2A, Mbat1 on in FIG. 3A, M12 on in FIGS. 5 and 6) have been on may be used to detect a fast hot-plug condition at block 708. Also, a failsafe indicator is useful to detect a fast hot-plug condition at block 708. In the method 700, a slow hot-plug condition at block 712 can be detected based on a second timing parameter indicating how long ESD protection operations (e.g., S1 on in FIG. 2A, Mbat1 on in FIG. 3A, M12 on in FIGS. 5 and 6) have been on may be used to detect a slow hot-plug condition at block 708, where the second timing parameter is a longer time interval compared to the first timing parameter. In addition, a failsafe indicator is useful to detect a slow hot-plug condition at block 708. As desired, different combinations of the hot-plug parameters described herein can be used to detect a hot-plug condition. Also, other hot-plug parameters could be used.

In some example embodiments, a circuit (e.g., a circuit of one of the BMS modules 108A-108N in FIG. 1, the monitor and protect circuit 202 in FIG. 2A, or the BMS module IC 308 in FIG. 3) includes input terminals (e.g., CB16, VBAT) adapted to be coupled to a battery (e.g., one of the battery modules 104A-104N in FIGS. 1 and 2A-2B); a ground terminal (e.g., GND in the ESD protection circuit 210 of FIG. 3); and an ESD protection circuit (e.g., an ESD protection circuit for IC within one of the BMS modules 108A-108N, or the ESD protection circuit 210 of FIG. 2A or 3A) coupled to the input terminals. The ESD protection circuit includes a switch (e.g., S1 in FIG. 2A, Mbat1 in FIG. 3, M12 in FIGS. 5 and 6) coupled between the ground terminal and the input terminals. The ESD protection circuit also includes a control circuit (e.g., the control circuit 212 in FIG. 2, or the control circuit 500 in FIG. 5) coupled to the input terminals and to the switch, the control circuit configured to: detect an ESD event (e.g., a voltage transient with at least a threshold slew rate and/or magnitude) at one of the input terminals; detect a transient voltage at one of the input terminals (e.g., node 310, CB16, VBAT, BAT, CBTOP in the figures), in which the transient voltage is caused by an initial coupling of that input terminal to the battery (see the operations of the first and second slew rate detection circuits 502 and 506); detect a condition in which the switch has been closed for longer than a threshold amount of time; close the switch responsive to the detected ESD event; and open the switch responsive to the detected transient voltage or the detected condition.

In some example embodiments, the control circuit includes: a first slew rate circuit (e.g., the first slew rate circuit 502 in FIG. 5) coupled to a first of the input terminals, wherein the first slew rate circuit is configured to detect the transient voltage at the first of the input terminals; and a second slew rate circuit (e.g., the second slew rate circuit 506 in FIG. 5) coupled to a second of the input terminals, wherein the second slew rate circuit is configured to detect the transient voltage at the second of the input terminals. In some example embodiments, the control circuit is configured to open the switch based on the transient voltage detected at the first of the input terminals and the transient voltage detected at the second of the input terminals. In some example embodiments, the control circuit further includes a timing circuit (e.g., M5-M8 and C1 in FIG. 5) coupled to the first and second slew rate circuits and configured to detect the condition, and wherein the control circuit is configured to open the switch responsive to the transient voltage detected at the first of the input terminals, the transient voltage detected at the second of the input terminals, and the condition.

In some example embodiments, the control circuit further includes a control input terminal (e.g., FAILSAFE input to the control circuit 312 in FIG. 3A), and wherein the control circuit is configured to open the switch only if a control signal at the control input indicates the circuit is not powered on. In some example embodiments, the control circuit further includes a timing circuit (e.g., M9, M10, R10, R11, and C2 in FIG. 5) configured to detect the condition, and wherein the control circuit is configured to open the switch responsive to the condition and responsive to the control signal indicating the circuit is not powered on. In some example embodiments, the control circuit includes: a first RC circuit (e.g., M5-M8 and C1 in FIG. 5) configured to detect the condition, wherein the control circuit is configured to open the switch responsive to the condition, the transient voltage detected at the first of the input terminals, and the transient voltage detected at the second of the input terminals; and a second RC circuit (e.g., M9, M10, R10, R11, and C2 in FIG. 5) configured to detect an additional condition indicating the switch has been closed for more than another threshold amount of time greater than the threshold of time, wherein the control circuit is configured to open the switch based on the additional condition without regard to the transient voltage detected at the first of the input terminals nor the transient voltage detected at the second of the input terminals. In some example embodiments, the circuit is part of a module (e.g., one of the BSM modules 108A-108N) configured to perform battery cell monitoring operations, battery cell balancing operations, and ESD protection operations including an ESD protection circuit disable function that opens the switch based the transient voltage or the condition.

In some example embodiments, an ESD protection circuit (e.g., an ESD protection circuit for IC within one of the BMS modules 108A-108N, or the ESD protection circuit 210 of FIG. 2A or 3A) includes a switch (e.g., S1 in FIG. 2A, Mbat1 in FIG. 3A, or M12 in FIGS. 5 and 6) adapted to be coupled between input terminals (e.g., node 310, CB16, VBAT, BAT, CBTOP in the figures) and a ground terminal (e.g., GND in the ESD protection circuit 210 of FIG. 3A) of an IC (e.g., monitor and protect circuit 202 in FIG. 2A, or BMS module IC 308 in FIG. 3). The ESD protection circuit also includes a control circuit (e.g., the control circuit 212 in FIG. 2A, the control circuit 312 in FIG. 3A, or the control circuit 500 in FIG. 5) adapted to be coupled to the input terminals and to the switch. The control circuit is configured to: detect a set of parameters including: a first parameter indicating an ESD event; a second parameter indicating a transient voltage at one of the input terminals, in which the transient voltage is caused by an initial coupling of that input terminal to a battery; a third parameter indicating a condition in which the switch has been closed for longer than a threshold amount of time; close the switch responsive to the first parameter; and open the switch responsive to the second or third parameters. In some example embodiments, the control circuit is configured to: monitor the second parameter at a first of the input terminals; monitor the second parameter at a second of the input terminals; and open the switch responsive to the second parameter at both the first of the input terminals and the second of the input terminals. In some example embodiments, the second parameter indicates the transient voltage has a slew rate greater than a threshold. In some example embodiments, the threshold amount of time is at least 100 ns. some example embodiments, the threshold amount of time is at least 9 us.

In some example embodiments, the control circuit is configured to: detect a fourth parameter (FAILSAFE) indicating the IC is not powered; and open the switch responsive to the fourth parameter in combination with one of the second or third parameters. some example embodiments, the control circuit includes: a first RC circuit (e.g., M5-M8 and C1 in FIG. 5) configured to provide the third parameter, wherein the control circuit is configured to open the switch responsive to both the second parameter and the third parameter; a second RC circuit (e.g., M9, M10, R10, R11, and C2 in FIG. 5) configured to provide an additional parameter indicating when the switch has been closed for more than another threshold amount of time that is greater than the threshold amount of time, wherein control circuit is configured to open the switch responsive to the additional parameter without regard to the second parameter.

In some example embodiments, a battery-powered electrical system comprises includes: a battery module (e.g., one of the battery modules 104A-104N) having a plurality of battery cells; a connector (e.g., the lines between 104B in FIG. 2A and the BMS modules 108B in FIG. 2A) coupled to each of the plurality of battery cells; a printed circuit board (PCB) (e.g., part of each of the BMS modules 108A-108N) having: a plug interface (e.g., the set of switches 304 in FIGS. 3A-3C) compatible with the connector. The battery-powered electrical system also includes a circuit (e.g., a circuit of one of the BMS modules 108A-108N in FIG. 1, the monitor and protect circuit 202 in FIG. 2A, or the BMS module IC 308 in FIG. 3) coupled to the plug interface, wherein the circuit includes an ESD protection circuit (e.g., an ESD protection circuit for IC within one of the BMS modules 108A-108N, or the ESD protection circuit 210 of FIG. 2A or 3A) configured to detect a condition indicating the plug interface is being initially coupled to the connector and to stop an ESD protection operation responsive to the detected condition. In some example embodiments, the battery-powered electrical system is an electric vehicle.

In some example embodiments, the ESD protection circuit is configured to detect the condition based on a first slew rate at a first input terminal of the circuit and a second slew rate at a second input terminal of the circuit, and wherein the first and second input terminals are coupled to the plug interface. In some example embodiments, the ESD protection circuit is configured to detect the condition based on a timing parameter indicating a duration of the ESD protection operation in combination with the first slew rate and the second slew rate. In some example embodiments, the ESD protection circuit is configured to detect the condition based on a timing parameter indicating a duration of the ESD protection operation in combination with a parameter indicating the circuit is not powered.

In this description, the term "couple" may cover connections, communications, or signal paths that enable a functional relationship consistent with this description. For example, if device A generates a signal to control device B to perform an action, in a first example device A is coupled to device B by direct connection, or in a second example device A is coupled to device B through intervening component C if intervening component C does not alter the functional relationship between device A and device B such that device B is controlled by device A via the control signal generated by device A.

Modifications are possible in the described embodiments, and other embodiments are possible, within the scope of the claims.

What is claimed is:

1. A battery-powered electrical system, comprising:
   a battery module having a plurality of battery cells;
   a connector coupled to each of the plurality of battery cells; and
   a printed circuit board (PCB) having:
      a plug interface compatible with the connector; and
      a circuit coupled to the plug interface, wherein the circuit includes an electrostatic discharge (ESD)

protection circuit configured to detect a condition indicating the plug interface is being initially coupled to the connector and to stop an ESD protection operation responsive to the detected condition, and wherein the ESD protection circuit includes:
  a first timing circuit configured to determine a first interval of the ESD protection operation; and
  a second timing circuit configured to determine a second interval of the ESD protection operation, the second interval less than the first interval.

2. The battery-powered electrical system of claim 1, wherein the battery-powered electrical system is an electric vehicle.

3. The battery-powered electrical system of claim 1, wherein the ESD protection circuit is configured to detect the condition based on a first slew rate at a first input terminal of the circuit and a second slew rate at a second input terminal of the circuit, and wherein the first and second input terminals are coupled to the plug interface.

4. The battery-powered electrical system of claim 3, wherein the ESD protection circuit is configured to detect the condition based on a timing parameter indicating a duration of the ESD protection operation in combination with the first slew rate and the second slew rate.

5. The battery-powered electrical system of claim 1, wherein the ESD protection circuit is configured to detect the condition based on a timing parameter indicating a duration of the ESD protection operation in combination with a parameter indicating the circuit is not powered.

6. An electrostatic discharge (ESD) protection circuit, comprising:
  a first switch including a first current terminal, a second current terminal, and a control terminal, wherein the first current terminal of the first switch is adapted to be coupled to input terminals, and the second current terminal of the first switch is adapted to be coupled to a ground terminal of an integrated circuit (IC);
  a second switch including a first current terminal, a second current terminal, and a control terminal, wherein the first current terminal of the second switch is adapted to be coupled to the control terminal of the first switch, and the second current terminal of the second switch is adapted to be coupled to the ground terminal; and
  a control circuit adapted to be coupled to the control terminal of the first switch, the first current terminal of the second switch, and the control terminal of the second switch, the control circuit including:
    a first circuit configured to detect a first slew rate;
    a second circuit configured to detect a second slew rate; and
    a third circuit coupled to the first switch and the second switch.

7. The electrostatic discharge (ESD) protection circuit of claim 6, wherein:
  the first circuit includes:
    a first transistor including a control terminal, a first current terminal, and a second current terminal;
    a second transistor including a control terminal coupled to the second current terminal of the first transistor, a first current terminal coupled to the first current terminal of the first transistor, and a second current terminal coupled to a ground;
    a first resistor including a first terminal coupled to a first slew input terminal, and a second terminal coupled to the first terminal of the first transistor and the first terminal of the second transistor;
    a second resistor including a first terminal coupled to the control terminal of the first transistor, and a second terminal coupled to the ground;
    a third resistor including a first terminal coupled to the second terminal of the first transistor and the second terminal of the second transistor, and a second terminal; and
    a fourth resistor including a first terminal coupled to the second terminal of the third resistor, and a second terminal coupled to the ground.

8. The electrostatic discharge (ESD) protection circuit of claim 7, wherein:
  the second circuit includes:
    a third transistor including a control terminal, a first current terminal, and a second current terminal;
    a fourth transistor including a control terminal coupled to the second current terminal of the third transistor, a first current terminal coupled to the first current terminal of the third transistor, and a second current terminal coupled to a ground;
    a fifth resistor including a first terminal adapted to be coupled to a second slew input terminal, and a second terminal coupled to the first terminal of the third transistor and the first terminal of the fourth transistor;
    a sixth resistor including a first terminal coupled to the control terminal of the third transistor, and a second terminal coupled to the ground;
    a seventh resistor including a first terminal coupled to the second terminal of the third transistor and the second terminal of the fourth transistor, and a second terminal; and
    an eighth resistor including a first terminal coupled to the second terminal of the seventh resistor, and a second terminal coupled to the ground.

9. The electrostatic discharge (ESD) protection circuit of claim 8, wherein:
  the third circuit includes:
    a first timing circuit; and
    a second timing circuit.

10. The electrostatic discharge (ESD) protection circuit of claim 9, wherein:
  the first timing circuit includes:
    a fifth transistor including a control terminal coupled to the first circuit, a first current terminal, and a second current terminal;
    a sixth transistor including a control terminal coupled to the second circuit, a first current terminal, and a second current terminal;
    a seventh transistor including a control terminal coupled to a first terminal of a first capacitor, a first current terminal coupled to the second current terminal of the sixth transistor, and a second current terminal coupled to a second terminal of the first capacitor; and
    an eighth transistor including a control terminal coupled to the control terminal of the fifth transistor, a first current terminal coupled to an ESD_ON terminal, and a second current terminal coupled to the second current terminal of the fifth transistor and the first current terminal of the sixth transistor.

11. The electrostatic discharge (ESD) protection circuit of claim 10, wherein:
  the second timing circuit includes:

a ninth transistor including a control terminal, a first current terminal coupled to the first current terminal of the eighth transistor, and a second current terminal coupled to the second current terminal of the seventh transistor;

a second capacitor including a first terminal coupled to the control terminal of the ninth transistor, and a second terminal coupled to the second terminal of the first capacitor;

a tenth resistor including a first terminal, and a second terminal coupled to the first terminal of the second capacitor;

an eleventh resistor including a first terminal and a second terminal coupled to the second terminal of the second capacitor; and a tenth transistor including a control terminal coupled to the control terminal of the ninth transistor, a first current terminal coupled to the ESD_ON terminal, and a second current terminal coupled to the second current terminal of the ninth transistor.

12. The electrostatic discharge (ESD) protection circuit of claim 11, wherein:

in response to the first timing circuit determining an ESD_ON signal is present at the ESD_ON terminal for at least a first minimum time, the control circuit is configured to assert a first signal and a second signal.

13. The electrostatic discharge (ESD) protection circuit of claim 12, wherein:

in response to the second timing circuit determining an ESD_ON signal is present at the ESD_ON terminal for at least a second minimum time, the control circuit is configured to assert a third signal.

14. The electrostatic discharge (ESD) protection circuit of claim 13, wherein:

the first minimum time is 100 ns; and the second minimum time is 9 µs.

15. A method of electrostatic discharge (ESD) protection comprising:

determining, by a battery monitor of a system, an ESD event;

in response to determining the ESD event, discharging, by the battery monitor, energy associated with the ESD event within the system and determining whether the discharging reaches a first time limit and a second time limit, wherein the first time limit is longer than the second time limit;

determining, by the battery monitor, a hot-plug condition based on whether the discharging reaches one of the first time limit and the second time limit; and in response to determining the hot-plug condition, disabling, by the battery monitor, ESD protection.

16. The method of electrostatic discharge (ESD) protection of claim 15, further comprising:

connecting a battery pack to the battery monitor.

17. The method of electrostatic discharge (ESD) protection of claim 15, wherein:

the hot-plug condition is a fast hot-plug condition.

18. The method of electrostatic discharge (ESD) protection of claim 17, wherein:

the fast hot-plug condition is detected by the battery monitor based on a first slew rate and a second slew rate.

19. The method of electrostatic discharge (ESD) protection of claim 17, wherein:

the fast hot-plug condition is determined, by the battery monitor, based on the discharging reaching the first time limit and the battery monitor receiving a first signal and a second signal.

20. The method of electrostatic discharge (ESD) protection of claim 15, further comprising:

the hot-plug condition is a slow hot-plug condition.

* * * * *